(12) United States Patent
Yang et al.

(10) Patent No.: US 11,139,391 B2
(45) Date of Patent: Oct. 5, 2021

(54) IGBT DEVICE

(71) Applicant: SHANGHAI HUAHONG GRACE SEMICONDUCTOR MANUFACTURING CORPORATION, Shanghai (CN)

(72) Inventors: Jiye Yang, Shanghai (CN); Junjun Xing, Shanghai (CN); Jia Pan, Shanghai (CN); Hao Li, Shanghai (CN); Yi Lu, Shanghai (CN); Longjie Zhao, Shangahi (CN); Xukun Zhang, Shanghai (CN); Xuan Huang, Shanghai (CN); Chong Chen, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/566,050

(22) Filed: Sep. 10, 2019

(65) Prior Publication Data

US 2020/0219996 A1  Jul. 9, 2020

(30) Foreign Application Priority Data

Jan. 8, 2019 (CN) .......................... 201910014758.3

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0634* (2013.01); *H01L 29/0646* (2013.01);
(Continued)

(58) Field of Classification Search
CPC ............. H01L 29/7397; H01L 29/0634; H01L 29/0821; H01L 29/0696; H01L 29/0646;
(Continued)

(56) References Cited

U.S. PATENT DOCUMENTS

2007/0181927 A1* 8/2007 Yedinak .............. H01L 29/1095
257/302
2011/0169080 A1* 7/2011 Yun ..................... H01L 29/7811
257/341

(Continued)

FOREIGN PATENT DOCUMENTS

CN  102842612 A  12/2012
CN  108389901 A  8/2018

OTHER PUBLICATIONS

Search Report issued in corresponding Chinese Patent Application No. 2019100147583, dated Aug. 4, 2021.

*Primary Examiner* — Bilkis Jahan
*Assistant Examiner* — Victor V Barzykin
(74) *Attorney, Agent, or Firm* — MKG, LLC

(57) ABSTRACT

An IGBT device comprises a super-junction structure arranged in a drift region and formed by a plurality of N-type pillars and a plurality of P-type pillars which are alternately arrayed. Device cell structures of the IGBT device are formed in an N-type epitaxial layer at the tops of super-junction cells. Each device cell structure comprises a body region, a gate structure and an emitter region. N-type isolation layers having a doping concentration greater than that of the N-type epitaxial layer are formed between the bottom surfaces of the body regions and the top surfaces of the P-type pillars and are used for isolating the body regions from the P-type pillars. The super-junction structure and the N-type isolation layers can increase the current density of
(Continued)

the device, decrease the on-state voltage drop of the device and reduce the turn-off loss of the device.

11 Claims, 5 Drawing Sheets

(51) Int. Cl.
*H01L 29/08* (2006.01)
*H01L 29/10* (2006.01)
*H01L 29/423* (2006.01)
*H01L 29/36* (2006.01)
*H01L 29/49* (2006.01)

(52) U.S. Cl.
CPC ........ *H01L 29/0696* (2013.01); *H01L 29/086* (2013.01); *H01L 29/0821* (2013.01); *H01L 29/0865* (2013.01); *H01L 29/1095* (2013.01); *H01L 29/36* (2013.01); *H01L 29/4236* (2013.01); *H01L 29/4916* (2013.01); *H01L 29/7395* (2013.01)

(58) Field of Classification Search
CPC ............... H01L 29/086; H01L 29/0865; H01L 29/1095; H01L 29/4236; H01L 29/7395; H01L 29/36; H01L 29/4916
See application file for complete search history.

(56) References Cited

U.S. PATENT DOCUMENTS

| | | | |
|---|---|---|---|
| 2011/0220992 A1* | 9/2011 | Inomata | H01L 29/7813 257/330 |
| 2012/0153348 A1* | 6/2012 | Aono | H01L 29/0649 257/139 |
| 2014/0145245 A1* | 5/2014 | Harrington, III | H01L 29/42376 257/255 |
| 2015/0129930 A1* | 5/2015 | Aono | H01L 29/0696 257/142 |
| 2015/0303294 A1* | 10/2015 | Sakata | H01L 29/0696 257/330 |
| 2018/0248002 A1 | 8/2018 | Kawada et al. | |
| 2021/0057554 A1 | 2/2021 | Huang | |

* cited by examiner

IGBT DEVICE

CROSS REFERENCE TO RELATED APPLICATION

The present application claims priority to Chinese Patent Application No. 201910014758.3 filed on Jan. 8, 2019, the entirety of which is incorporated by reference herein.

TECHNICAL FIELD

The invention relates to a semiconductor integrated circuit, in particular to an insulated gate bipolar transistor (IGBT) device.

BACKGROUND OF THE INVENTION

As a voltage-controlled MOS bipolar hybrid device, IGBT has the major advantages of high input impedance, small input driving power, small on-resistance, high current capacity and high switching speed of bipolar junction-type power transistors and power MOSFETs and has become one of the important switch elements used for energy control and conversion of power electronic systems, and the performance of the IGBT has a direct influence on the conversion efficiency, size and weight of the power electronic systems.

IGBTs are very similar to VDMOSs in structure. FIG. 1 is a structural view of an existing IGBT. As shown in FIG. 1, the existing IGBT comprises a collector region, wherein the collector region is composed of a P-type layer 13 formed at the bottom of a silicon substrate, and a collector is led out of the back of the silicon substrate; the drift region is composed of a first N+ layer 12 and a first N− layer 11 sequentially formed on the collector region, the N-type impurity concentration of the first N+ layer 12 is greater than that of the first N− layer 11, and the first N+ layer 12 is used as a field stop (FS) layer; the P-well 16 is formed in the first N-layer 11; the emitter region is composed of a second N+ layer 14 formed on the P-well 16 and is isolated by the P-well 16 from the drift region; the P-well 16 is partially covered by the gate 21, the part, covered by the gate 21, of the P-well 16 is formed with a channel region, the parts, located on two sides of the P-well 16, of the drift region are connected through the channel region, the parts, located on two sides of the P-well 16, of the emitter region are also connected through the channel region, and the gate 21 is a trench gate structure, in FIG. 1; the P+ connection layer 15a penetrates through the second N+ layer 14 and is in contact with the P-well 16; the emitter 24a is in contact with the second N+ layer 14 and is led out of the P-well 16 via the P+ connection layer 15a; a field oxide 22 is used for isolation between devices, and a dielectric layer 23 is used for isolating a metal layer from the device. This IGBT is structurally different from existing VDMOSs in the following aspects: an N+ substrate of the existing VDMOSs is replaced with an N− substrate (namely, the first N− layer), and a P-layer (namely, the P-type layer 13) is added. This structure improvement leads to essential changes to the IGBT relative to the VDMOSs, thus, forming an MOS gate-controlled bipolar transistor structure. When the device is turned on, a large quantity of minority carriers are implanted into the first N− layer 11 from the P-type layer 13 to generate a powerful conductivity modulation effect on the first N− layer 11, so that the electrical resistivity of the first N− layer 11 is drastically reduced, and accordingly, the on-resistance of the device is less restrained by the electric resistivity and thickness of the first N− layer 11. The voltage resistance of the device can be improved by properly adjusting the electrical resistivity and thickness of the first N− layer 11 while the on-resistance will not be largely increased. Thus, the IGBT overcomes the intrinsic insurmountable contradiction between on-resistance and breakdown voltage of the VDMOSs.

To comply with the development tendency of power electronic devices towards higher current density, smaller on-state voltage drop and lower turn-off loss, it becomes very important to increase the current density and to decrease the on-state voltage drop (Vcesat) of IGBT devices.

BRIEF SUMMARY OF THE INVENTION

The technical issue to be settled by the invention is to provide an IGBT device having a larger current density and a smaller on-state voltage drop.

To settle the above technical issue, the IGBT device of the invention comprises:

A super-junction structure, wherein the super-junction structure is formed by a plurality of N-type pillars and a plurality of P-type pillars which are alternately arrayed, and each N-type pillar and the adjacent P-type pillar form a corresponding super-junction cell.

The super-junction structure is formed in an N-type epitaxial layer, and a P-type doped collector region is formed at the bottom of the N-type epitaxial layer.

The bottoms of the P-type pillars are spaced from the top surface of the collector region.

Device cell structures of the IGBT devices are formed in the N-type epitaxial layer at the tops of the super-junction cells, and the multiple device cell structures are connected in parallel to form the IGBT device.

Each device cell structure comprises:

A P-type doped body region, wherein;

an N-type isolation layer is formed between the bottom surface of the body region and the top surface of the corresponding P-type pillar and is used for isolating the body region from the corresponding P-type pillar;

a gate structure, wherein the gate structure comprises a dielectric layer and a polysilicon gate, and a channel is formed in a surface, covered by the polysilicon gate, of the body region;

an emitter_region formed on the surface of the body region by an N+ region; and a drift region formed by the corresponding N-type pillar and the N-type epitaxial layer at the top and bottom of the N-type pillar, wherein the emitter_region and the drift region are connected through the channel.

The super-junction structure and the N-type isolation layers increase the current density of the IGBT device and decrease the on-state voltage drop of the IGBT device.

Furthermore, an N-type doped field stop layer is formed in the N-type epitaxial layer and is located on the front of the collector region, the doping concentration of the field stop layer is greater than that of the N-type epitaxial layer, and the top surface of the field stop layer is spaced from the bottom surfaces of the P-type pillars.

Furthermore, the gate structure is a trench gate comprising a gate trench, the dielectric layer is formed on the bottom surface and side face of the gate trench, and the gate trench is filled with the polysilicon gate.

Furthermore, the gate trench is located at the top of the corresponding N-type pillar and penetrates through the body region and the N-type isolation region, and a channel is formed in a surface, covered by the side face of the polysilicon gate, of the body region.

Furthermore, the gate structure is a planar gate, the gate dielectric layer and the polysilicon gate are sequentially disposed on the surface of the body region and extend to the surface of the N-type epitaxial layer outside the body region, and a channel is formed in a surface, covered by the front of the polysilicon gate, of the body region.

Furthermore, the gate dielectric layer is a gate oxide.

Furthermore, a body lead-out region is formed on the surface of the body region by a P+ region.

Furthermore, the surfaces of the emitter_region, the polysilicon gate and the body region are covered with an interlayer film.

Furthermore, contact holes penetrating through the interlayer film are separately formed in the top of the emitter-_region and the top of the polysilicon gate.

Front metal layer pattern structures are formed on the surface of the interlayer film and separately constitute an emitter and a gate, the emitter makes contact with the emitter region at the bottom of the emitter via the corresponding contact hole, and the gate makes contact with the polysilicon gate at the bottom of the gate via the corresponding contact hole.

A collector is formed on the bottom surface of the collector region by a back metal layer.

Furthermore, the P-type pillars are formed by a P-type epitaxial layer filled in a super-junction trench, the super-junction trench is formed in the N-type epitaxial layer, and the N-type pillars are formed by the parts, between the P-type pillars, of the N-type epitaxial layer.

Furthermore, the P-type pillars are formed by a P-type ion-implanted region formed in a selected area of the N-type epitaxial layer. Particularly, the N-type epitaxial layer corresponding to the super-junction structure is formed by multiple times of epitaxial growth, and P-type ion implantation is conducted every time the N-type epitaxial layer epitaxially grows, so as to form one part of the P-type ion-implanted region corresponding to the P-type pillars.

Furthermore, the N-type pillars are formed by the parts, between the P-type pillars, of the N-type epitaxial layer.

Furthermore, N-type impurities of the N-type isolation layer are formed by N-type impurities of the N-type epitaxial layer and N-type ion implantation impurities overlapping with the N-type impurities of the N-type epitaxial layer.

Furthermore, the doping concentration of the P-type pillars is $1E14\ cm^{-3}$-$5E16\ cm^{-3}$, and the doping concentration of the N-type pillars is $1E14\ cm^{-3}$-$5E16\ cm^{-3}$.

Furthermore, the doping concentration of the collector region is $5E11\ cm^{-3}$-$5E16\ cm^{-3}$.

Furthermore, the doping concentration of the field stop layer is $5E11\ cm^{-3}$-$5E16\ cm^{-3}$.

Furthermore, the N-type epitaxial layer is a silicon epitaxial layer and is formed on the surface of a silicon substrate.

Furthermore, the collector region is formed by conducting ion implantation on the back of the silicon substrate after the back of the silicon substrate is thinned.

The super-junction structure is introduced into the drift region of the IGBT device to improve the voltage resistance of the device and to increase the doping concentration of the drift region while maintaining the voltage resistance; meanwhile, the N-type isolation layers are introduced to the bottoms of the body regions to isolate the body regions from the P-type pillars, so that the situation that holes stretch into the body regions due to the contact between the P-type pillars and the body regions is prevented; and holes directly stretch into the body regions after entering the drift regions from the back, so that the on-resistance in the drift regions is increased. The super-junction structure and the corresponding N-type isolation layers can decrease the doping concentration of the drift regions and can prevent holes from stretching into the body regions via the P-type pillars, and by increasing the doping concentration and hole concentration of the drift regions, the on-resistance and on-state voltage drop of the device are decreased, and accordingly, the current density of the device is increased, and the on-state voltage drop of the device is reduced. In addition, the turn-off loss (Eoff) of the device can be reduced.

BRIEF DESCRIPTION OF THE DRAWINGS

The invention is further detailed below with reference to the accompanying drawings and specific embodiments.

DETAILED DESCRIPTION OF PREFERRED EMBODIMENTS OF THE INVENTION

Figure 1:
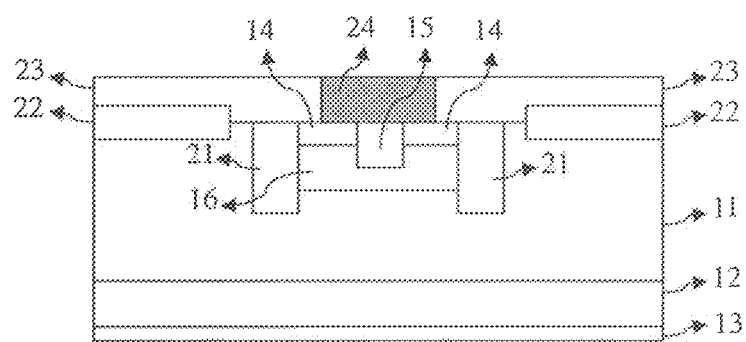
FIG. 1 is a structural view of an existing IGBT device.
Figure 2:
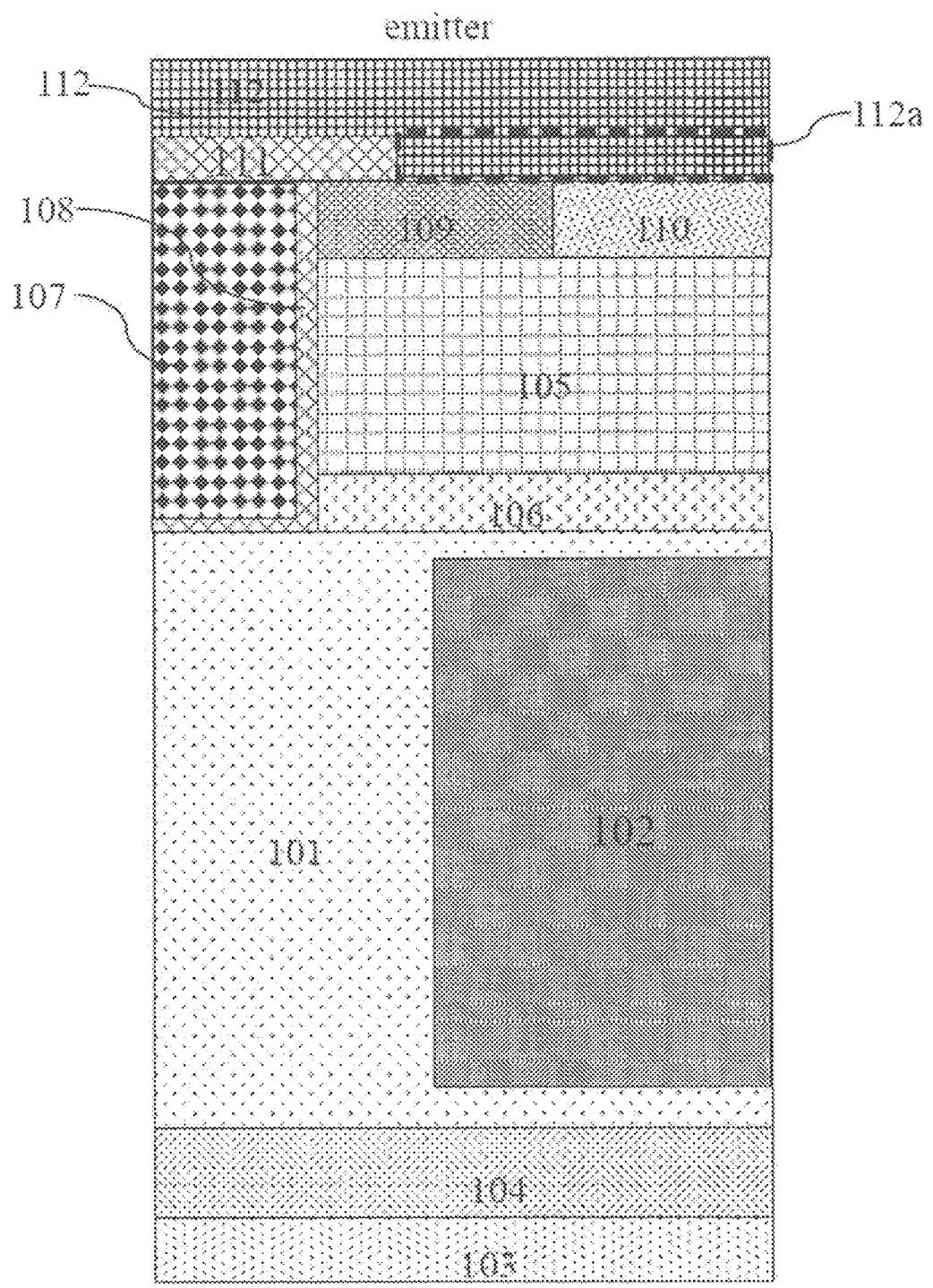
FIG. 2 is a structural view of an IGBT device of the invention.

FIG. 2 is a structural view of an IGBT device of the invention. As shown in FIG. 2, the IGBT device in this embodiment comprises:

a super-junction structure, wherein the super-junction structure is formed by a plurality of N-type pillars 101 and a plurality of P-type pillars 102 which are alternately arrayed, and each N-type pillar 101 and the adjacent P-type pillar 102 form a corresponding super-junction cell.

The super-junction structure is formed in an N-type epitaxial layer 101, and a P-type doped collector region 103 is formed at the bottom of the N-type epitaxial layer 101.

In this embodiment, the N-type epitaxial layer 101 is a silicon epitaxial layer and is formed on the surface of a silicon substrate. The collector region 103 is formed by conducting ion implantation on the back of the silicon substrate after the back of the silicon substrate is thinned.

In this embodiment, the P-type pillars 102 are formed by a P-type epitaxial layer filled in a super-junction trench, the super-junction trench is formed in the N-type epitaxial layer 101, and the N-type pillars 101 are formed by the parts, located between the P-type pillars 102, of the N-type epitaxial layer 101. As the N-type pillars are formed by the corresponding N-type epitaxial layer, the N-type pillars and the N-type epitaxial layer are all represented by reference sign 101, in this embodiment.

Or, in other embodiments, the P-type pillars 102 are formed by a P-type ion-implanted region formed in a selected area of the N-type epitaxial layer 101. Particularly, the N-type epitaxial layer 101 corresponding to the super-junction structure is formed by multiple times of epitaxial growth, and P-type ion implantation is conducted every time the N-type epitaxial layer 101 epitaxially grows, so as to form one part of the P-type ion-implanted region corresponding to the P-type pillars 102. The N-type pillars 101 are formed by the parts, between the P-type pillars 102, of the N-type epitaxial layer 101.

The bottoms of the P-type pillars 102 are spaced from the top surface of the collector region 103.

Device cell structures of the IGBT device are formed in the N-type epitaxial layer 101 at the tops of the super-junction cells, and the multiple device cell structures are connected in parallel to form the IGBT device. Only one device cell structure and one super-junction cell are shown in FIG. 2.

Each device cell structure comprises:

a P-type doped body region 105, wherein:

An N-type isolation layer 106 is formed between the bottom surface of the body region 105 and the top surface of the corresponding P-type pillar 102 and is used for isolating the body region 105 from the corresponding P-type pillar 102; the N-type isolation layer 106 is of a floating structure, thus also being called a floating layer;

In this embodiment, N-type impurities of the N-type isolation layer 106 are formed by N-type impurities of the N-type epitaxial layer 101 and N-type ion implantation impurities overlapping with the N-type impurities of the N-type epitaxial layer 101; the N-type doping concentration of the N-type isolation layer 106 is set according to the doping concentrations of the body region 105 and the corresponding P-type pillar 102 as well as the distance between the body region 105 and the corresponding P-type pillar 102, so as to make sure that the body region 105 is isolated from the corresponding P-type pillar 102;

a gate structure, wherein the gate structure comprises a gate dielectric layer 108 and a polysilicon gate 107, and a channel is formed in a surface, covered by the polysilicon gate 107, of the body region 105;

an emitter_region 109 formed on the surface of the body region 105 by an N+ region; and a drift region formed by the corresponding N-type pillar 101 and the N-type epitaxial layer 101 at the top and bottom of the N-type pillar 101, wherein the emitter_region 109 and the drift region are connected through the channel.

The super-junction structure and the N-type isolation layers 106 increase the current density of the IGBT device and decrease the on-state voltage drop of the IGBT device.

In this embodiment, an N-type doped field stop layer 104 is formed in the N-type epitaxial layer 101 and is located on the front of the collector region 103, the doping concentration of the field stop layer 104 is greater than that of the N-type epitaxial layer 101, and the top surface of the field stop layer 104 is spaced from the bottom surfaces of the P-type pillars 102.

In this embodiment, the gate structure is a trench gate comprising a gate trench, the gate dielectric layer 108 is formed on the bottom surface and side face of the gate trench, and the gate trench is filled with the polysilicon gate 107.

The gate trench is located at the top of the corresponding N-type pillar 101 and penetrates through the body region 105 and the N-type isolation region, and a channel is formed in a surface, covered by the side face of the polysilicon gate 107, of the body region 105.

Or, in other embodiments, the gate structure is a planar gate, the gate dielectric layer 108 and the polysilicon gate 107 sequentially disposed on the surface of the body region 105 and extend to the surface of the N-type epitaxial layer 101 outside the body region 105, and a channel is formed in a surface, covered by the front of the polysilicon gate 107, of the body region 105.

The gate dielectric layer 108 is a gate oxide.

A body lead-out region 110 is formed on the surface of the body region 105 by a P+ region.

The surfaces of the emitter_region 109, the polysilicon gate 107 and the body region 105 are covered with an interlayer film 111.

Contact holes penetrating through the interlayer film 111 are separately formed in the top of the emitter_region 109 and the top of the polysilicon gate 107.

Front metal layer 112 pattern structures are formed on the surface of the interlayer film 111 and separately constitute an emitter and a gate, the emitter makes contact with the emitter region 109 at the bottom of the emitter via the corresponding contact hole 112a, and the gate makes contact with the polysilicon gate 107 at the bottom of the gate via the corresponding contact hole.

A collector formed on the bottom surface of the collector region 103 by a back metal layer.

For the sake of a better description of the invention, specific parameters adopted in this embodiment are illustrated below:

The doping concentration of the P-type pillars 102 is $1E14\ cm^{-3}$-$5E16\ cm^{-3}$, and the doping concentration of the N-type pillars 101 is $1E14\ cm^{-3}$-$5E16\ cm^{-3}$.

The doping concentration of the collector region 103 is 5E11 cm-3-5E16 cm-3.

The doping concentration of the field stop layer 104 is 5E1 cm-3-5E16 cm-3.

The super-junction structure is introduced into the drift region of the IGBT device and can increase the voltage resistance of the device and increase the doping concentration of the drift region while maintaining the voltage resistance; meanwhile, the N-type isolation layers 106 are introduced to the bottoms of the body regions 105 to isolate the body regions 105 from the P-type pillars 102, so that the situation that holes stretch into the body regions 105 due to the contact between the P-type pillars 102 and the body regions 105 is prevented; and holes directly stretch into the body regions 102 after entering the drift regions from the back, so that the on-resistance in the drift regions is increased. The super-junction structure and the corresponding N-type isolation layers 106 can decrease the doping concentration of the drift region and can prevent holes from stretching into the body region 105 via the P-type pillars 102, and by increasing the doping concentration and hole concentration of the drift region, the on-resistance and on-state voltage drop of the device is decreased, and accordingly, the current density of the device is increased, and the on-state voltage drop of the device is reduced. In addition, the turn-off loss (Eoff) of the device can be reduced.

Figure 3A:
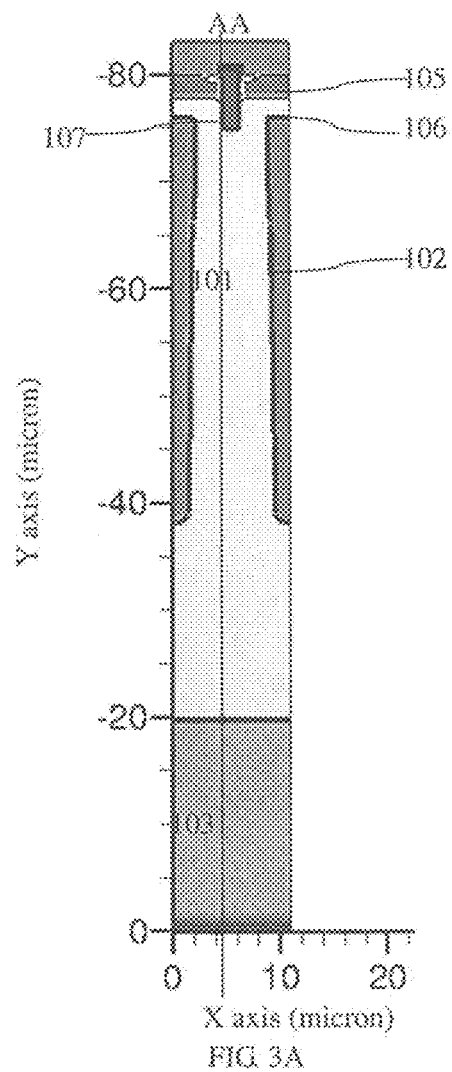
FIG. 3A is a structure simulation diagram of the IGBT device of the invention.
Figure 3B:
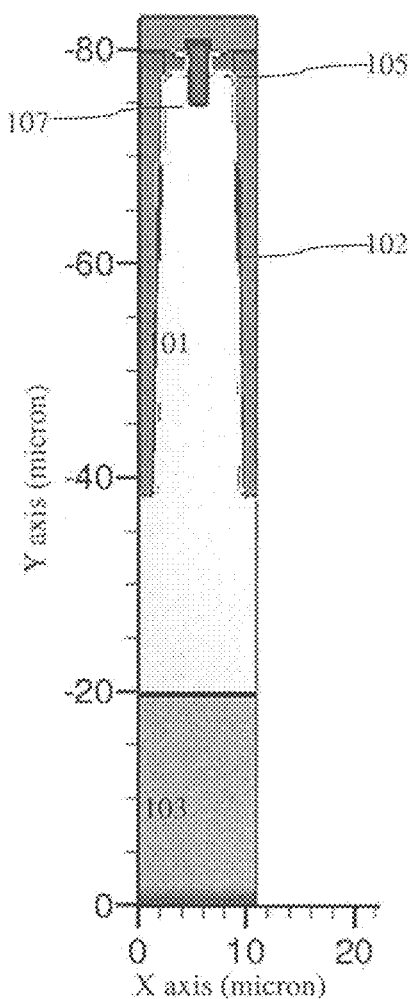
FIG. 3B is a structure simulation diagram of an existing IGBT device provided with a super-junction structure.

FIG. 3A is a structure simulation diagram of the IGBT device of the invention, and FIG. 3B is a structure simulation diagram of an existing IGBT device provided with a super-junction structure. As shown in FIG. 3B, the drift region of the IGBT device is also provided with a super-junction structure; however, due to the fact that the super-junction structure is directly disposed in the drift region, the hole current density of the drift region is decreased, which is not beneficial to the increase of the current density and the decrease of the on-state voltage of the device.

Figure 3C:
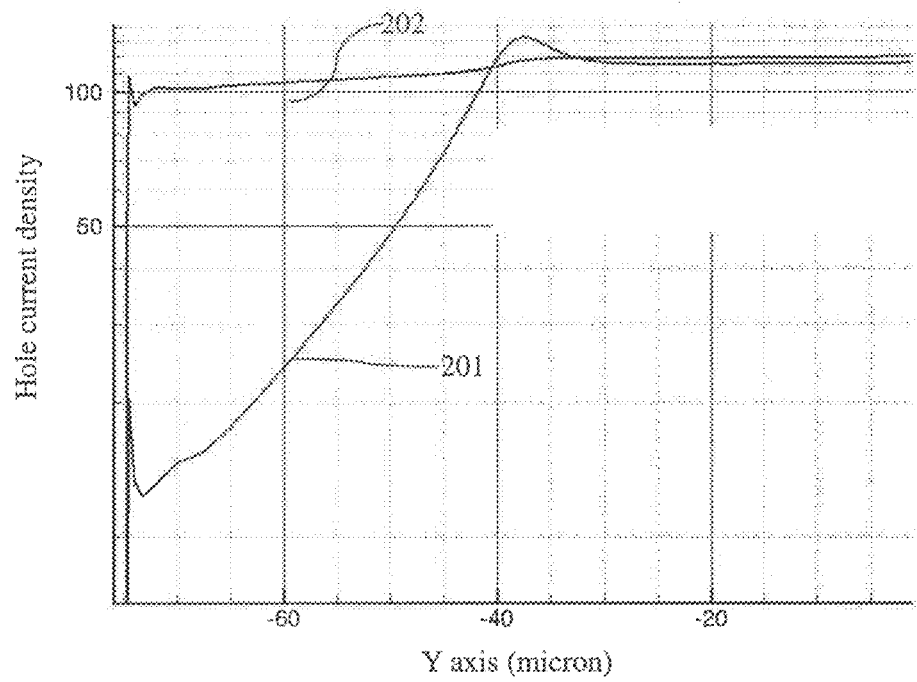
FIG. 3C shows a hole current density distribution curve of the device along line AA in FIG. 3A of the invention.

By comparing FIG. 3B with FIG. 3A, the top of the P-type pillar 102 in FIG. 3B directly makes contact with the body region 105; however, in this embodiment of the invention, the floating N-type isolation layer 106 is directly arranged between the P-type pillar 102 and the body region 105 as shown in FIG. 3A, so that the hole loss, caused by the contact between the P-type pillar 102 and the body region 105, in the drift region is prevented, and thus, the hole current density in the drift region is increased. FIG. 3C shows a hole current density distribution curve 202 of the device along line AA in FIG. 3A of the invention, and for comparison, curve 201 is a hole current density distribution curve of the IGBT device provided with the super-junction structure in FIG. 3B. As can be seen, the values in curve 202 are much greater than the values in curve 201 within the depth range of the super-junction structure, and the drift region within the depth range of the super-junction structure corresponds to the range from −75 microns to −40 microns on the Y axis, as shown in FIG. 3A.

Figure 3D:
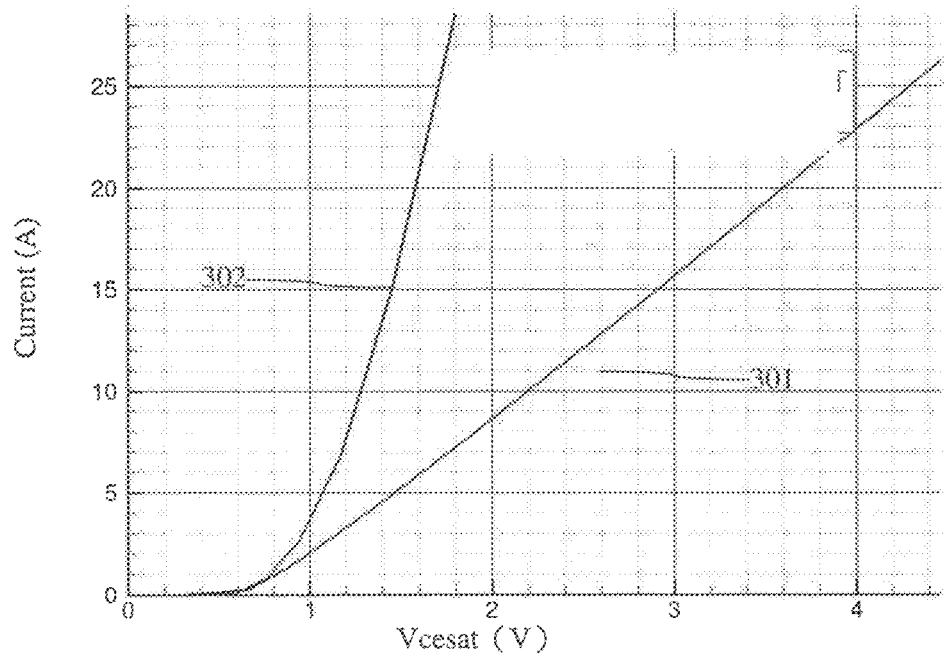
FIG. 3D shows an on-current and Vcesat curve of the device of the invention.

By increasing the hole current density, the current density of the device can be increased, and the on-state voltage drop Vcesat of the device can be decreased. FIG. 3D shows an on-current and Vcesat curve 302 of the device of the invention and also an on-current and Vcesat curve 301 of the IGBT device provided with the super-junction structure in FIG. 3B, for comparison. As can be seen, the on-current of the device in this embodiment is increased, and Vcesat of the device in this embodiment is decreased. For instance, under the on-current of 20 A, corresponding Vcesat in curve 302 is 1.6V, and corresponding Vcesat in curve 301 is 3.6V, which means that Vcesat is decreased by 2V in this embodiment.

The invention is expounded above with specific embodiments, but these embodiments are not intended to limit the invention. Various transformations and improvements can be made by those skilled in this field without deviating from the principle of the invention, and all these transformations and improvements should also fall within the protection scope of the invention.

What is claimed is:

1. An IGBT device, comprising:
   a super-junction structure, wherein the super-junction structure is formed by a plurality of N-type pillars and a plurality of P-type pillars which are alternately arrayed, and each said N-type pillar and the adjacent P-type pillar form a corresponding super-junction cell;
   the super-junction structure is formed in an N-type epitaxial layer, and a P-type doped collector region is formed at a bottom of the N-type epitaxial layer;
   bottoms of the P-type pillars are spaced from a top surface of the collector region;
   device cell structures of the IGBT devices are formed in the N-type epitaxial layer at tops of the super-junction cells, and the multiple device cell structures are connected in parallel to form the IGBT device;
   each said device cell structure comprises:
      a P-type doped body region, wherein;
      an N-type isolation layer is formed between a bottom surface of the body region and a top surface of the corresponding P-type pillar and is used for isolating the body region from the corresponding P-type pillar, wherein the N-type isolation layer prevents the holes injected into a drift region from the collector region from entering the body region through the P-type pillars;
      N-type impurities of the N-type isolation layer include N-type impurities of the N-type epitaxial layer and N-type ion implantation impurities overlapping with the N-type impurities of the N-type epitaxial layer,
      a gate structure, wherein the gate structure comprises a dielectric layer and a polysilicon gate, and a channel is formed in a surface, covered by the polysilicon gate, of the body region;
      an emitter region formed on a surface of the body region by an N+ region; and
      the drift region formed by the corresponding N-type pillar and the N-type epitaxial layer at a top and bottom of the N-type pillar, and the emitter region and the drift region are connected through the channel;
   the super-junction structure and the N-type isolation layers increase the current density of the IGBT device and decrease the on-state voltage drop of the IGBT device;
   wherein the gate structure is a trench gate comprising a gate trench, the dielectric layer is formed on a bottom surface and side face of the gate trench, and the gate trench is filled with the polysilicon gate; and
   wherein the gate trench is located directly above the N-type pillar of the super-junction cell at the bottom of the device cell structure and penetrates through the body region and the N-type isolation region, and the channel is formed in a surface, covered by a side face of the polysilicon gate, of the body region.

2. The IGBT device according to claim 1, wherein an N-type doped field stop layer is formed in the N-type epitaxial layer and is located on a front of the collector region, a doping concentration of the field stop layer is greater than that of the N-type epitaxial layer, and a top surface of the field stop layer is spaced from bottom surfaces of the P-type pillars.

3. The IGBT device according to claim 1, wherein the gate dielectric layer is a gate oxide.

4. The IGBT device according to claim 1, wherein a body lead-out region is formed on the surface of the body region by a P+ region.

5. The IGBT device according to claim 1, wherein surfaces of the emitter region, the polysilicon gate and the body region are covered with an interlayer film;
   wherein contact holes penetrating through the interlayer film are separately formed in a top of the emitter region and a top of the polysilicon gate;
   wherein front metal layer pattern structures are formed on a surface of the interlayer film and each of the front metal layer pattern structures forms an emitter, the emitter makes contact with the emitter region at a bottom of the emitter via the corresponding contact hole; and
   wherein a collector is formed on a bottom surface of the collector region by a back metal layer.

6. The IGBT device according to claim 1, wherein the P-type pillars are formed by a P-type ion-implanted region formed in a selected area of the N-type epitaxial layer; particularly, the N-type epitaxial layer corresponding to the super-junction structure is formed by multiple times of epitaxial growth, and P-type ion implantation is conducted every time the N-type epitaxial layer epitaxially grows, so as to form one part of the P-type ion-implanted region corresponding to the P-type pillars; and
   wherein the N-type pillars are formed by parts, between the P-type pillars, of the N-type epitaxial layer.

7. The IGBT device according to claim 1, wherein the P-type pillars have a doping concentration of $1E14$ $cm^{-3}$-$5E16$ $cm^{-3}$, and the N-type pillars has a doping concentration of $1E14$ $cm^{-3}$-$5E16$ $cm^{-3}$.

8. The IGBT device according to claim 1, wherein the collector region has a doping concentration of $5E11$ $cm^{-3}$-$5E16$ $cm^{-3}$.

9. The IGBT device according to claim 2, wherein the field stop layer has a doping concentration of $5E11$ $cm^{-3}$-$5E16$ $cm^{-3}$.

10. The IGBT device according to claim 1, wherein the N-type epitaxial layer is a silicon epitaxial layer and is formed on a surface of a silicon substrate.

11. The IGBT device according to claim 10, wherein the collector region is formed by conducting ion implantation on a back of the silicon substrate after the back of the silicon substrate is thinned.

* * * * *